(12) United States Patent
Shin et al.

(10) Patent No.: US 9,082,774 B1
(45) Date of Patent: Jul. 14, 2015

(54) DISPLAY DEVICE

(71) Applicant: LG DISPLAY CO., LTD., Seoul (KR)

(72) Inventors: Minjae Shin, Paju-si (KR); JeongHwan Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/561,932

(22) Filed: Dec. 5, 2014

(30) Foreign Application Priority Data

Jul. 21, 2014 (KR) .................. 10-2014-0091725

(51) Int. Cl.
| | |
|---|---|
| *H01L 27/32* | (2006.01) |
| *H01L 23/544* | (2006.01) |
| *H01L 27/15* | (2006.01) |
| *H01L 33/62* | (2010.01) |
| *H01L 33/00* | (2010.01) |

(52) U.S. Cl.
CPC ............ *H01L 23/544* (2013.01); *H01L 27/156* (2013.01); *H01L 33/005* (2013.01); *H01L 33/62* (2013.01); *H01L 2933/0016* (2013.01); *H01L 2933/0066* (2013.01)

(58) Field of Classification Search
CPC .... G09G 2300/043; G09G 3/32; H01L 27/32; H01L 27/3241; H01L 27/3248
USPC ......................................... 257/797; 438/401
See application file for complete search history.

(56) References Cited

U.S. PATENT DOCUMENTS

| | | | | |
|---|---|---|---|---|
| 5,949,502 | A * | 9/1999 | Matsunaga et al. | 349/40 |
| 7,477,341 | B2 * | 1/2009 | Lee et al. | 349/73 |
| 7,532,277 | B2 * | 5/2009 | Kwon et al. | 349/110 |
| 7,567,335 | B2 * | 7/2009 | Lee et al. | 349/187 |
| 7,719,637 | B2 * | 5/2010 | SangYoon et al. | 349/110 |
| 7,728,945 | B2 * | 6/2010 | Liu et al. | 349/149 |
| 7,808,608 | B2 * | 10/2010 | Park et al. | 349/191 |
| 7,825,529 | B2 * | 11/2010 | Horii | 257/797 |
| 8,035,238 | B2 * | 10/2011 | Kim et al. | 257/797 |
| 8,049,222 | B2 * | 11/2011 | Sohn et al. | 257/72 |
| 8,324,744 | B2 * | 12/2012 | Kim et al. | 257/797 |
| 2007/0040286 | A1 * | 2/2007 | Liu et al. | 257/797 |
| 2007/0284763 | A1 * | 12/2007 | Kim et al. | 257/797 |
| 2011/0157114 | A1 * | 6/2011 | Ko et al. | 345/206 |
| 2014/0111116 | A1 * | 4/2014 | Shin et al. | 315/312 |

* cited by examiner

*Primary Examiner* — Earl Taylor
(74) *Attorney, Agent, or Firm* — McKenna Long & Aldridge LLP

(57) ABSTRACT

A display device including a substrate having a display area and a non-display area. The non-display area is outside of the display area. A plurality of drivers on the non-display area of the substrate. Each of the drivers having a first alignment mark on a first side of the driver and a second alignment mark on a second side of the driver. A first contact pad having a third alignment mark on a first portion of the non-display area of the substrate. A second contact pad having a fourth alignment mark on a second portion of the non-display area of the substrate. The third alignment mark of the first contact pad corresponds to the first alignment mark of the driver and the fourth alignment mark of the second contact pad corresponds to the second alignment mark of the driver.

22 Claims, 4 Drawing Sheets

DISPLAY DEVICE

CROSS-REFERENCE TO RELATED APPLICATIONS

This application claims the benefit of the Korean Patent Application No. 10-2014-0091725 filed on Jul. 21, 2014, which is hereby incorporated by reference as if fully set forth herein.

BACKGROUND

1. Field of the Invention

The present disclosure relates to a display device, and more particularly, to an alignment structure which is provided between a signal pad and a signal driver, for connecting the signal driver to the signal pad.

2. Discussion of the Related Art

Liquid crystal display (LCD) devices, plasma display panels (PDPs), organic light emitting display devices (OLED), etc. have been developed as flat panel display devices replacing cathode ray tubes (CRTs). In such flat panel display devices, a large-sized screen has been realized by reducing the weight and the volume of the display devices and a quality has been greatly enhanced from continuous research and development for better response time and image quality, etc.

Recently, in addition to research and development in technology, research and development in product design is being done to appeal to consumers. As an example of such research and development, a borderless display device has been proposed in which an upper case is removed, and thus, a separate case is not exposed to a display surface which displays an image. Therefore, the aesthetic appearance of the borderless display device is enhanced in design, and thus, the borderless display device satisfies the purchase requirements of consumers. However, various problems occur in the manufacturing process.

Hereinafter, a related art display device will be described with reference to the drawing.

FIG. 1 is a schematic plan view of a related art display device.

As seen in FIG. 1, the related art display device includes a substrate 10, a gate driver 20, and a data driver 30.

The substrate 10 includes a display area, which displays an image, and a non-display area which cannot display an image. The non-display area is formed outside the display area.

A plurality of pixels are formed in the display area. Each of the plurality of pixels includes a gate line, a data line, and a thin film transistor (TFT). Each pixel emits light of a certain wavelength.

The gate driver 20 is attached to a first side of the substrate 10, and for example, is attached to a left non-display area of the substrate 10. The gate driver 20 supplies a gate signal to the gate line. To this end, the gate driver 20 is electrically connected to a gate pad 26 which is provided in the left non-display area of the substrate 10, and the gate pad 26 is connected to the gate line through a gate link 25.

The gate driver 20 includes a flexible printed circuit film connected to the gate pad 26 and a gate driving integrated circuit (IC) 21 mounted on the flexible printed circuit film. The gate driving IC 21 generates the gate signal, and supplies the generated gate signal to the gate pad 26 through the flexible printed circuit film.

The data driver 30 is attached to a second side of the substrate 10, and for example, is attached to an upper non-display area of the substrate 10. The data driver 30 supplies a data signal to the data line. To this end, the data driver 30 is electrically connected to a data pad 36 which is provided in the upper non-display area of the substrate 10, and the data pad 36 is connected to the data line through a data link 35.

The data driver 30 includes a flexible printed circuit film connected to the data pad 36 and a data driving IC 31 mounted on the flexible printed circuit film. The data driving IC 31 generates the data signal, and supplies the generated data signal to the data pad 36 through the flexible printed circuit film.

A process of aligning the gate pad 26 and the gate driver 20 is performed for connecting the gate driver 20 to the gate pad 26. Also, a process of aligning the data pad 36 and the data driver 30 is performed for connecting the data driver 30 to the data pad 36.

In an enlarged view of FIG. 1, for convenience, only an element for aligning the data pad 36 and the data driver 30 is illustrated.

As seen in the enlarged view of FIG. 1, an alignment process of aligning the data pad 36 and the data driver 30 is performed by using a first alignment mark 40 and a second alignment mark 50.

The first alignment mark 40 is formed at the data driver 30, and in more detail, is formed on the flexible printed circuit film of the data driver 30.

The second alignment mark 50 is formed on the substrate 10, and in more detail, is formed in the upper non-display area of the substrate 10.

The first alignment mark 40 includes an accommodating groove for accommodating the second alignment mark 50. The second alignment mark 50 is formed in a tetragonal structure such that it can be accommodated in the accommodating groove.

Therefore, the alignment process is performed in order for the second alignment mark 50 formed on the substrate 10 to be accommodated in the accommodating groove of the first alignment mark 40 formed on the data driver 30. In this state, the data driver 30 is connected to the data pad 36.

FIGS. 2A and 2B are process views illustrating a process of aligning the data driver with the data pad in the related art display device, and relate to the above-described display device of FIG. 1. Therefore, like reference numerals refer to like elements throughout.

First, as seen in FIG. 2A, a position of the data driver 30 is adjusted while moving the data driver 30 to an upper side of the substrate 10, so that the second alignment mark 50 formed on the substrate 10 is accommodated in the accommodating groove of the first alignment mark 40 formed on the data driver 30.

Subsequently, as seen in FIG. 2B, the alignment process of aligning the data driver 30 and the data pad 36 formed on the substrate 10 is finished by lowering the data driver 30 in a state where the second alignment mark 50 is accommodated in the accommodating groove of the first alignment mark 40.

As described above, in the related art, the alignment process of aligning the data driver 30 and the data pad 36 is performed by using the first alignment mark 40 which is formed on the data driver 30 and includes the accommodating groove, and the second alignment mark 50 which is formed on the substrate 10 and is accommodated in the accommodating groove. In this case, there is a problem in which the first alignment mark 40 is recognized at a display surface of the display device.

In particular, in the related art, since the first alignment mark 40 formed in the data driver 30 should include the accommodating groove, there is a limitation in decreasing a size of the first alignment mark 40. The size of the first alignment mark 40 is very large at the display surface and causes reduced visibility. For this reason, it is difficult to apply the first alignment mark 40 to a borderless display device in which aesthetics is very important.

SUMMARY

Accordingly, embodiments of the present invention are directed to a display device and a method of forming the same that substantially obviates one or more problems due to limitations and disadvantages of the related art.

An advantage of the present invention is to provide a display device that reduces a problem in which an alignment mark formed in a data driver is recognized at a display surface.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these other advantages and in accordance with the purpose of the invention, as embodied and broadly described herein, there is provided a display device comprising a substrate including a display area and a non-display area, where the non-display area is outside of the display area, a plurality of drivers on the non-display area of the substrate, each of the drivers having a first alignment mark on a first side of the driver and a second alignment mark on a second side of the driver, a first contact pad having a third alignment mark on a first portion of the non-display area of the substrate, a second contact pad having a fourth alignment mark on a second portion of the non-display area of the substrate, where the third alignment mark of the first contact pad corresponds to the first alignment mark of the driver and the fourth alignment mark of the second contact pad corresponds to the second alignment mark of the driver.

A display device comprising a substrate having a display area and a non-display area, the non-display area being outside the display area, an electrode on the non-display area, a contact pad on the non-display area of the substrate having one alignment mark, the contact pad electrically connected to the electrode, a driver in the non-display area having another alignment mark, the driver being connected to the contact pad, where the one alignment mark of the contact pad corresponds to the another alignment mark of the driver.

A method of forming a display device comprising the steps of, forming a substrate having a display area and a non-display area, the non-display area being outside the display area, forming an electrode on the non-display area. forming a contact pad on the non-display area of the substrate having one alignment mark, the contact pad electrically connected to the electrode. forming a driver in the non-display area having another alignment mark, the driver being connected to the contact pad. where the one alignment mark of the contact pad corresponds to the another alignment mark of the driver.

A method of forming a display device comprising the steps of, forming a substrate including a display area and a non-display area, wherein the non-display area is outside of the display area, forming a plurality of drivers on the non-display area of the substrate, each of the drivers having a first alignment mark on a first side of the driver and a second alignment mark on a second side of the driver, forming a first contact pad having a third alignment mark on a first portion of the non-display area of the substrate, forming a second contact pad having a fourth alignment mark on a second portion of the non-display area of the substrate, where the third alignment mark of the first contact pad corresponds to the first alignment mark of the driver and the fourth alignment mark of the second contact pad corresponds to the second alignment mark of the driver.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
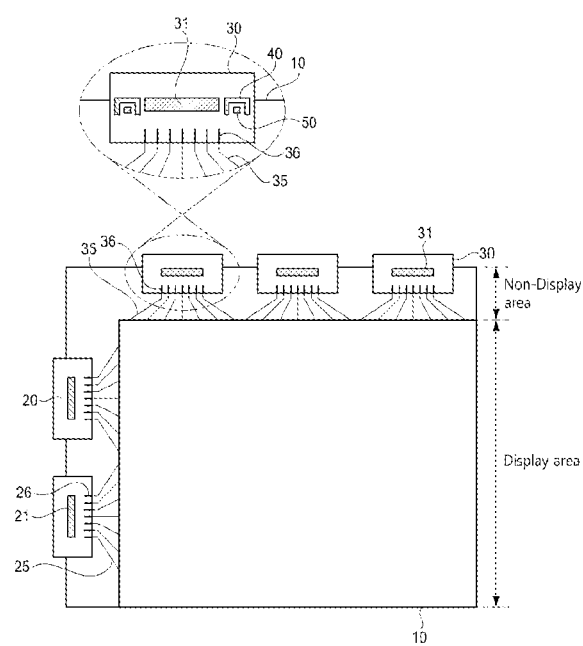
FIG. 1 is a schematic plan view of a related art display device.
Figure 2A:
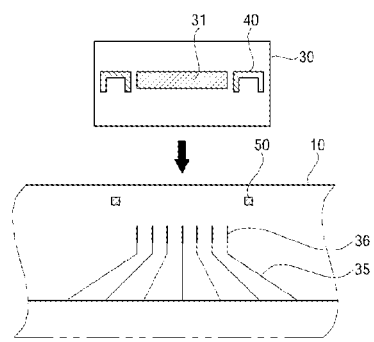
FIGS. 2A and 2B are process views illustrating a process of aligning a data driver with a data pad, in the related art display device.
Figure 2B:
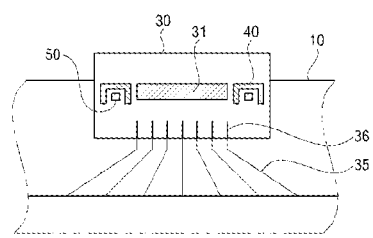
Figure 3:
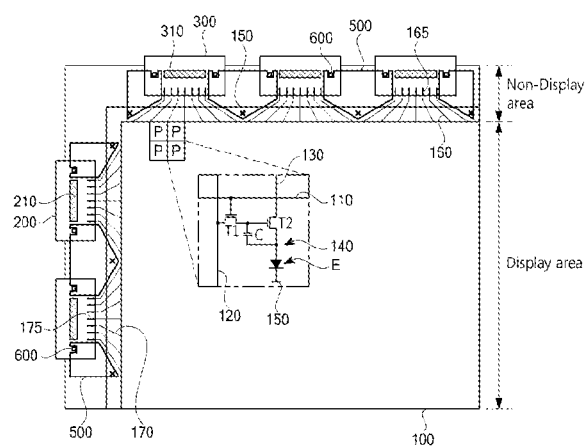
FIG. 3 is a schematic plan view of a display device according to an embodiment of the present invention.

FIG. 3 is a schematic plan view of a display device according to an embodiment of the present invention, and relates to an organic light emitting display device.

As seen in FIG. 3, the display device according to an embodiment of the present invention includes a substrate 100, a gate driver 200, and a data driver 300.

The substrate 100 includes a display area which displays an image, and a non-display area which cannot display an image. The display area is formed at a central portion of the substrate 100, and the non-display area is formed outside the display area.

A plurality of pixels P are formed in the display area of the substrate 100. Each of the plurality of pixels P includes a gate line 110, a data line 120, a high-level voltage line 130, a switching thin film transistor (TFT) T1, a driving TFT T2, a capacitor C, a first electrode 140, a second electrode 150, and a light emitting diode E.

The gate line 110 supplies a gate signal, supplied by the gate driver 200, to the switching TFT T1.

The data line 120 supplies a data signal, supplied by the data driver 300, to the switching TFT T1.

The high-level voltage line 130 supplies a high-level voltage, supplied via the data driver 300, to the driving TFT T2.

The switching TFT T1 is turned on according to the gate signal supplied to the gate line 110, and supplies the data signal, supplied from the data line 120, to the driving TFT T2.

The driving TFT T2 is turned on according to the data signal supplied from the switching TFT T1 to generate a data current corresponding to the data signal, and supplies the data current to the LED E.

The capacitor C holds the data signal, supplied to the driving TFT T2, during each frame. The capacitor C is connected to a gate terminal and a source terminal of the driving TFT T2.

The first electrode 140 is connected to the driving TFT T2 and the light emitting diode E. The first electrode 140 may act as an anode of an organic light emitting display device.

The second electrode 150 is connected to the light emitting diode E. The second electrode 150 may act as a cathode of the organic light emitting display device.

The second electrode 150 is formed all over the display area of the substrate 100, and extends to a partial region of the non-display area of the substrate 100. The second electrode 150 is connected to a contact pad 500 which is provided in the non-display area of the substrate 100. In particular, the second electrode 150 and the contact pad 500 are provided on different layers, and thus, the second electrode 150 is connected to the contact pad 500 through a contact hole which is formed in the non-display area. In the drawing, the contact hole is referred to by X. In more detail, the contact pad 500 may be provided on the same layer as that of the gate line 110 or the data line 120, and the second electrode 150 may be formed above the contact pad 500.

As described above, since the second electrode 150 extends to the non-display area of the substrate 100 and is electrically connected to the contact pad 500 through the contact hole X which is formed in the non-display area, a light transmittance is not reduced in the display area.

The light emitting diode E includes an organic emission layer that emits light. In the organic emission layer, a hole generated from the first electrode 140 is combined with an electron generated from the second electrode 150, thereby emitting light of a certain wavelength.

The light emitting diode E may further include a hole injection layer and a hole transport layer, which are formed between the first electrode 140 and the organic emission layer, and an electron injection layer and an electron transport layer which are formed between the second electrode 150 and the organic emission layer. The light emitting diode E may be changed to various types known to those skilled in the art.

A data link line 160, a data pad 165, a gate link line 170, a gate pad 175, and the contact pad 500 are provided in the non-display area of the substrate 100.

One end of the data link line 160 is connected to the data line 120, and the other end of the data link line 160 is connected to the data pad 165. Also, the data pad 165 is connected to the data driver 300.

Therefore, the data signal supplied from the data driver 300 is supplied to the data line 120 through the data pad 165 and the data link line 160.

A plurality of the data link lines 160 constitute one data link line set, which is connected to one of the data drivers 300.

One end of the gate link line 170 is connected to the gate line 110, and the other end of the gate link line 170 is connected to the gate pad 175. Also, the gate pad 175 is connected to the gate driver 200.

Therefore, the gate signal supplied from the gate driver 200 is supplied to the gate line 110 through the gate pad 175 and the gate link line 170.

A plurality of the gate link lines 170 constitute one gate link line set, which is connected to one of the gate drivers 200.

The contact pad 500 may be provided in an area between the data link lines 160, and in more detail, in an area between two adjacent data link line sets. The contact pad 500 may be provided in an area between the gate link lines 170, and in more detail, in an area between two adjacent gate link line sets. However, the present embodiment is not limited thereto. For example, the contact pad 500 may be provided in only an area between two adjacent data link line sets. Further, the contact pad 500 may have a shape of a baseball home plate.

As described below, the contact pad 500 includes an accommodating groove which is formed in the contact pad 500, and a process of aligning both of the data driver 300 and the gate driver 200 is performed by using the accommodating groove. Therefore, the contact pad 500 may be provided in an area between two adjacent data link line sets and in an area between two adjacent gate link line sets. The gate driver 200 may be provided in a gate-in panel (GIP) structure where the gate driver 200 is directly provided on the substrate 100. In this case, only a process of aligning the data driver 300 is needed, and thus, in the GIP structure, the contact pad 500 may be provided in only an area between two adjacent data link line sets.

The contact pad 500, as described above, is connected to the second electrode 150 through the contact hole. Also, the contact pad 500 may be electrically connected to a printed circuit board (PCB, not shown) through the data driver 300. To this end, a connection line (not shown) that connects the contact pad 500 to the PCB is formed in the data driver 300.

The gate driver 200 is attached to a first side of the substrate 100, and for example, is attached to a left non-display area of the substrate 100. The gate driver 200 supplies the gate signal to the gate line 110. To this end, the gate driver 200 is electrically connected to the gate pad 175 which is provided in the left non-display area of the substrate 100, and the gate pad 175 is connected to the gate line 110 through the gate link line 170.

The gate driver 200 includes a flexible printed circuit film, which configures a body of the gate driver 200, and a gate driving IC 210 mounted on the flexible printed circuit film.

A gate driving pad (not shown) corresponding to the gate pad 175 is provided on the flexible printed circuit film. Aligning the gate driver 200 and the gate pad 175 is for connecting the gate pad 175 to the gate driving pad of the flexible printed circuit film configuring the gate driver 200. Therefore, in the present specification, aligning the gate driver 200 and the gate pad 175 substantially denotes aligning of the gate driving pad and the gate pad 175.

The gate driving IC 210 generates the gate signal, and supplies the generated gate signal to the gate pad 175 through the gate driving pad of the flexible printed circuit film.

An alignment mark 600 is formed at the gate driver 200, and in more detail, is formed on the flexible printed circuit film of the gate driver 200. The alignment mark 600 is formed in a pattern (for example, a tetragonal pattern) able to be accommodated in the accommodating groove of the contact pad 500.

Although not shown, the gate driver 200 may be provided in a right non-display area of the substrate 100. Also, the gate driver 200 may be provided in a chip-on glass (COG) structure where the gate driving IC is mounted on the substrate 100, or may be provided in the GIP structure where the gate driving IC is directly provided on the substrate 100.

The data driver 300 is attached to a second side of the substrate 100, and for example, is attached to an upper non-display area of the substrate 100. The data driver 300 supplies the data signal to the data line 120. To this end, the data driver 300 is electrically connected to the data pad 165 which is provided in the upper non-display area of the substrate 100, and the data pad 165 is connected to the data line 120 through the data link line 160.

The data driver 300 includes a flexible printed circuit film, which forms a body of the data driver 300, and a data driving IC 310 mounted on the flexible printed circuit film.

A data driving pad (not shown) corresponding to the data pad 165 is provided on the flexible printed circuit film. Aligning the data driver 300 and the data pad 165 connects the data pad 165 to the data driving pad of the flexible printed circuit film forming the data driver 300. Therefore, in the present specification, aligning the data driver 300 and the data pad 165 substantially denotes aligning of the data driving pad and the data pad 165.

The data driving IC 310 generates the data signal, and supplies the generated data signal to the data pad 165 through the data driving pad of the flexible printed circuit film.

An alignment mark 600 is formed at the data driver 300, and in more detail, is formed on the flexible printed circuit film of the data driver 300. The alignment mark 600 is formed in a pattern (for example, a tetragonal pattern) able to be accommodated in the accommodating groove of the contact pad 500.

Although not shown, the data driver 300 may be provided in a lower non-display area of the substrate 100.

Moreover, although not shown, a PCB is connected to the data driver 300. The PCB supplies digital input data to the data driver 300, supplies a high-level voltage to the high-level voltage line 130, and supplies a low-level voltage to the second electrode 150.

In order for the PCB to supply the high-level voltage to the high-level voltage line 130, one circuit line of the PCB may be connected to the high-level voltage line 130 through a connection line which is formed in the data driver 300.

Moreover, in order for the PCB to supply the low-level voltage to the second electrode 150, one circuit line of the PCB may be connected to the contact pad 500 through a connection line which is formed in the data driver 300.

Figure 4A:
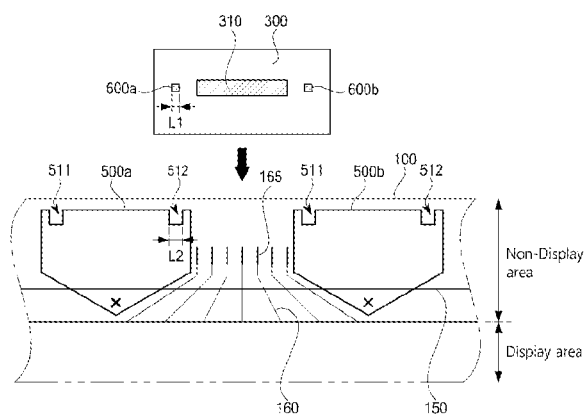
FIGS. 4A and 4B are process views illustrating a process of aligning a data driver with a data pad, in the display device according to an embodiment of the present invention.
Figure 4B:
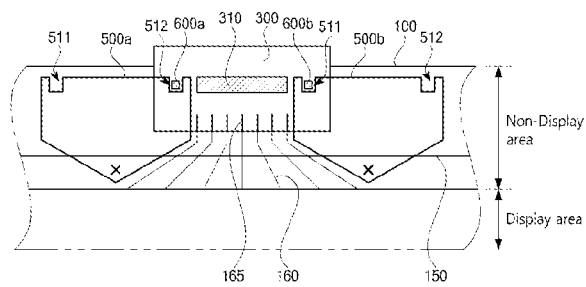

FIGS. 4A and 4B are process views illustrating a process of aligning the data driver with the data pad, in the display device according to an embodiment of the present invention, and relates to the above-described display device of FIG. 3. Therefore, like reference numerals refer to like elements throughout. Although not shown in detail, a process of aligning the gate driver with the gate pad is the same as a below-described process.

First, the data driver 300 and the elements of the substrate 100 corresponding thereto will be described in more detail, and then, the alignment process will be described.

As seen in FIG. 4A, the second electrode 150 extends from the display area to the non-display area of the substrate 100. Also, a plurality of contact pads 500a and 500b are provided in the non-display area of the substrate 100. The contact pads 500a and 500b are electrically connected to the second electrode 150 through the contact hole X.

The contact pads 500a and 500b include a first contact pad 500a, corresponding to one side of the data driver 300, and a second contact pad 500b corresponding to the other side of the data driver 300.

The first and second contact pads 500a and 500b are laterally separated from each other with respect to a plurality of the data link lines 160 (i.e., one data link line set) connected to one of the data drivers 300. The plurality of data link lines 160 are connected to the data pad 165.

Each of the first and second contact pads 500a and 500b includes a first accommodating groove 511 which is formed at one side thereof, and a second accommodating groove 512 which is formed at the other side thereof. A shape of each of the first and second accommodating grooves 511 and 512 may be formed in a tetragonal structure, but the present embodiment is not limited thereto. Also, the contact pad 500 may have a shape of a baseball home plate.

The data driver 300 includes the data driving IC 310 and a plurality of alignment marks 600a and 600b. The alignment marks 600a and 600b include a first alignment mark 600a which is formed at one side of the data driver 300, and a second alignment mark 600b which is formed at the other side of the data driver 300.

A shape of each of the alignment marks 600a and 600b may be formed in a tetragonal structure including, for example, a rectangular shape, but the present embodiment is not limited thereto.

The first alignment mark 600a is accommodated in the second accommodating groove 512 of the first contact pad 500a, and the second alignment mark 600b is accommodated in the first accommodating groove 511 of the second contact pad 500a. In this way, two alignment marks including the first and second alignment marks 600a and 600b are formed on one of the data drivers 300 and are respectively accommodated in the accommodating groove of the first contact pad 500a and the accommodating groove of the second contact pad 500b, and thus, an alignment process is more precisely performed.

Moreover, the first and second accommodating grooves 511 and 512 are formed on the contact pad 500a (or 500b), and the different alignment marks 600 of the data driver 300 are respectively accommodated in the first and second accommodating grooves 511 and 512. Therefore, the number of the contact pads does not increase, and an alignment process can be precisely performed.

A width L1 of the first alignment mark 600a is formed less than a width L2 of the second accommodating groove 512 of the first contact pad 500a. Also, a width L1 of the second alignment mark 600b is formed less than a width L2 of the first accommodating groove 511 of the second contact pad 500b. This is because a visual alignment process cannot be performed when the width L1 of the first alignment mark 600a is equal to or greater than the width L2 of the second accommodating groove 512 of the first contact pad 500a or the width L1 of the second alignment mark 600b is equal to or greater than the width L2 of the first accommodating groove 511 of the second contact pad 500b. Each of the widths L1 and L2 denotes a width in a direction parallel to an outer side of the display device. For example, when the alignment process is performed at an upper side of the display device, each of the widths L1 and L2 denotes a width in a widthwise direction that is a direction parallel to an upper side of the display device, and when the alignment process is performed at a left side of the display device, each of the widths L1 and L2 denotes a width in a longitudinal direction that is a direction parallel to a left side of the display device.

A process of aligning the data driver 300, having the above-described configuration, with the data pad 165 will be described as follows.

First, as seen in FIG. 4A, a position of the data driver 300 is adjusted while moving the data driver 300 to an upper side of the substrate 100, so that the first alignment mark 600a formed in the data driver 300 is accommodated in the second accommodating groove 512 of the first contact pad 500a formed on the substrate 100, and the second alignment mark 600b formed in the data driver 300 is accommodated in the first accommodating groove 511 of the second contact pad 500b formed on the substrate 100.

Subsequently, as seen in FIG. 4B, the alignment process of aligning the data driver 300 and the data pad 165 formed on the substrate 100 is completed by lowering the data driver 300 in a state where the first alignment mark 600a is accommodated in the second accommodating groove 512 of the first contact pad 500a, and the second alignment mark 600b is accommodated in the first accommodating groove 511 of the second contact pad 500b.

According to the above-described embodiment of the present invention, an accommodating groove is formed in the contact pad 500 which is electrically connected to an electrode (for example, the cathode of the organic light emitting display device) which is applied for emitting light from the display area, and is used as alignment mark, and thus, it is not required to form a separate alignment mark on the substrate 100.

Moreover, according to an embodiment of the present invention, since an accommodating groove is not formed in the alignment mark 600 which is formed in each of the gate driver 200 and the data driver 300, a size of the alignment mark 600 is reduced, and thus, the size of the alignment mark 600 which is recognized at a display surface can be minimized. Accordingly, in comparison with the related art, visibility can be enhanced, and it is possible to apply the alignment mark 600 to a borderless display device which highly regards aesthetics.

In the present specification, a signal driver is a generic name for the gate driver 200 and the data driver 300, and a signal pad is a generic name for the gate pad 175 and the data pad 165.

Hereinabove, an organic light emitting display device has been described as an example of the display device, but the present invention is not limited to the organic light emitting display device. For example, the display device according to an embodiment of the present invention may be an LCD device, in which case each of the contact pads 500a and 500b may be electrically connected to a common electrode of the LCD device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a substrate including a display area and a non-display area, wherein the non-display area is outside of the display area;
   a plurality of drivers on the non-display area of the substrate, each of the drivers having a first alignment mark on a first side of the driver and a second alignment mark on a second side of the driver;
   a first contact pad having a third alignment mark on a first portion of the non-display area of the substrate;
   a second contact pad having a fourth alignment mark on a second portion of the non-display area of the substrate;
   wherein the third alignment mark of the first contact pad corresponds to the first alignment mark of the driver and the fourth alignment mark of the second contact pad corresponds to the second alignment mark of the driver.

2. The display device of claim 1, further comprising a light emitting diode in each pixel of the display and an electrode connected to the light emitting diode, the first contact pad electrically connected to the electrode through a contact hole.

3. The display device of claim 1, further comprising a light emitting diode in each pixel of the display and an electrode connected to the light emitting diode, the first contact pad extending over the electrode.

4. The display device of claim 1, wherein the third alignment mark includes a groove configured to receive the first alignment mark.

5. The display device of claim 1, wherein the fourth alignment mark includes a groove configured to receive the second alignment mark.

6. The display device of claim 1, wherein the first alignment mark is a rectangular shape.

7. The display device of claim 1, wherein the second alignment mark is rectangular shape.

8. The display device of claim 1, wherein the first contact pad has a shape of a baseball home plate.

9. The display device of claim 1, further comprising data pads between the first and second contact pads.

10. The display device of claim 1, further comprising data link lines between the first and second contact pads.

11. A display device comprising:
    a substrate having a display area and a non-display area, the non-display area being outside the display area;
    an electrode on the non-display area;
    a contact pad on the non-display area of the substrate having one alignment mark, the contact pad electrically connected to the electrode;
    a driver in the non-display area having another alignment mark, the driver being connected to the contact pad;
    wherein the one alignment mark of the contact pad corresponds to the another alignment mark of the driver.

12. The display device of claim 11, further comprising a light emitting diode in each pixel of the display and an electrode connected to the light emitting diode, the contact pad electrically connected to the electrode through a contact hole.

13. The display device of claim 11, further comprising a light emitting diode in each pixel of the display and an electrode connected to the light emitting diode, the contact pad extending over the electrode.

14. The display device of claim 11, wherein the alignment mark of the contact pad includes a groove configured to receive the alignment mark of the driver.

15. The display device of claim 11, wherein another alignment mark of the contact pad includes a groove configured to receive another alignment mark of the driver.

16. The display device of claim 11, wherein the alignment mark of the driver is a rectangular shape.

17. The display device of claim 15, wherein the another alignment mark of the driver is rectangular shape.

18. The display device of claim 11, wherein the contact pad has a shape of a baseball home plate.

19. The display device of claim 11, further comprising data pads between the contact pad and the another contact pad.

20. The display device of claim 11, further comprising data link lines between the contact pad and the another contact pad.

21. A method of forming a display device comprising the steps of:
    forming a substrate having a display area and a non-display area, the non-display area being outside the display area;
    forming an electrode on the non-display area;
    forming a contact pad on the non-display area of the substrate having one alignment mark, the contact pad electrically connected to the electrode;
    forming a driver in the non-display area having another alignment mark, the driver being connected to the contact pad;
    wherein the one alignment mark of the contact pad corresponds to the another alignment mark of the driver.

22. A method of forming a display device comprising the steps of:

forming a substrate including a display area and a non-display area, wherein the non-display area is outside of the display area;

forming a plurality of drivers on the non-display area of the substrate, each of the drivers having a first alignment mark on a first side of the driver and a second alignment mark on a second side of the driver;

forming a first contact pad having a third alignment mark on a first portion of the non-display area of the substrate;

forming a second contact pad having a fourth alignment mark on a second portion of the non-display area of the substrate;

wherein the third alignment mark of the first contact pad corresponds to the first alignment mark of the driver and the fourth alignment mark of the second contact pad corresponds to the second alignment mark of the driver.

* * * * *